(12) United States Patent
Osaka

(10) Patent No.: US 7,888,985 B2
(45) Date of Patent: Feb. 15, 2011

(54) LEVEL SHIFT CIRCUIT

(75) Inventor: Shohei Osaka, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 12/607,646

(22) Filed: Oct. 28, 2009

(65) Prior Publication Data

US 2010/0123478 A1    May 20, 2010

(30) Foreign Application Priority Data

Nov. 17, 2008    (JP)    ............... 2008-293416

(51) Int. Cl.
  *H03L 5/00*    (2006.01)
  *H03K 19/0175*    (2006.01)
(52) U.S. Cl. ............... 327/333; 327/321; 327/309; 326/63; 326/80; 326/68; 326/83
(58) Field of Classification Search .......... 327/333, 327/321; 326/63, 68, 80, 83
  See application file for complete search history.

(56) References Cited

U.S. PATENT DOCUMENTS

| | | | | |
|---|---|---|---|---|
| 5,543,740 A | * | 8/1996 | Wong | 327/108 |
| 6,501,321 B2 | * | 12/2002 | Kumagai | 327/333 |
| 6,646,469 B2 | * | 11/2003 | Yushan | 326/83 |
| 7,538,581 B2 | * | 5/2009 | Walker | 326/68 |
| 7,639,060 B2 | * | 12/2009 | Shiraki et al. | 327/333 |
| 7,724,034 B2 | * | 5/2010 | Tsu et al. | 326/82 |

FOREIGN PATENT DOCUMENTS

JP    2005-512444    4/2005

OTHER PUBLICATIONS

U.S. Appl. No. 12/612,306, filed Nov. 4, 2009, Osaka.

* cited by examiner

*Primary Examiner*—Vibol Tan
(74) *Attorney, Agent, or Firm*—Oblon, Spivak, McClelland, Maier & Neustadt, L.L.P.

(57) ABSTRACT

A level shift circuit shifts a first voltage level to a second voltage level that is different from the first voltage level. The level shift circuit includes a set-level circuit 21 configured to detect and transmit a set signal that is used to set a logic voltage state based on the second voltage level, a reset-level circuit 22 configured to detect and transmit a reset signal that is used to reset the logic voltage state based on the second voltage level, and a reference-level circuit C3 configured to provide a reference signal that is used to detect the set signal and reset signal based on the second voltage level. The set-level circuit, reset-level circuit, and reference-level circuit transmit signals from the first voltage level to the second voltage level through capacitors C1, C2, and C3, respectively.

2 Claims, 9 Drawing Sheets

LEVEL SHIFT CIRCUIT

BACKGROUND OF THE INVENTION

1. Field of the Invention

The present invention relates to a level shift circuit for shifting voltage levels from one to another in accordance with voltages needed by switches of a half-bridge configuration.

2. Description of the Related Art

A related level shift circuit is disclosed in Published Japanese Translation of PCT Application No. 2005-512444. This level shift circuit is for high- and low-side switches of a half-bridge configuration. In the half-bridge configuration, a high-side ground voltage at a midpoint of the high- and low-side switches greatly varies in the range of, for example, 0 V to 400 V with respect to a ground voltage in synchronization with ON/OFF operation of the high- and low-side switches. To drive the high-side switch in such circumstances, a high-side driver capable of applying a voltage higher than the high-side ground voltage is connected to a gate of the high-side switch.

The level shift circuit is connected to the high-side driver and includes first and second capacitors those are two passive devices. A rise edge of a pulse signal is supplied through a first driver to the first capacitor. The rise edge of the pulse signal is inverted through an inverter into a fall edge, which is supplied to the second capacitor. With the rise and fall edges, the first and second capacitors generate necessary currents.

Namely, the first and second capacitors generate temporary currents those are used to set/reset a latch at the timing appropriate for properly driving half-bridge drivers or similar circuits. The latch outputs a set/reset signal in response to which the high-side driver turns on/off the high-side switch.

If charging voltages of the first and second capacitors vary due to external factors other than set and reset signals, temporary currents pass through the first and second capacitors.

SUMMARY OF THE INVENTION

According to the related art mentioned above, the midpoint of the high- and low-side switches of the half bridge configuration is connected, in some cases, to an inductance load such as a transformer and a reactor. When the switching operation of the high- and low-side switches causes a voltage or current variation, an inductance component of the inductance load causes oscillation.

This oscillation totally oscillates high-side voltages to the high-side driver because the midpoint of the high- and low-side switches provides a high-side ground voltage for the high-side driver. If it happens, charging voltages of the first and second capacitors change irrespective of set signal and reset signals, to pass temporary currents. Those result in malfunctioning the latch and incorrectly transmitting signals to the high-side switch.

The present invention provides a level shift circuit capable of preventing malfunctions due to noise components onto a high-side ground of a high-side switch and correctly transmitting signals.

According to an aspect of the present invention, the level shift circuit for shifting a first voltage level to a second voltage level that is different from the first voltage level includes a set-level circuit configured to detect and transmit a set signal that is used to set a logic voltage state of the second voltage level; a reset-level circuit configured to detect and transmit a reset signal that is used to reset the logic voltage state of the second voltage level; and a reference-level circuit configured to provide a reference signal that is used to detect the set signal and reset signal based on the second voltage level. The set-level circuit, reset-level circuit, and reference-level circuit transmit signals from the first voltage level to the second voltage level through capacitors, respectively.

According to another aspect of the present invention, the set-level circuit detects a voltage difference between the set signal and the reference signal, and if the voltage difference is equal to or greater than a predetermined value, sets the logic voltage state. The reset-level circuit detects a voltage difference between the reset signal and the reference signal, and if the voltage difference is equal to or greater than the predetermined value, resets the logic voltage state.

DESCRIPTION OF THE PREFERRED EMBODIMENT

Level shift circuits according to embodiments of the present invention will be explained in detail with reference to the drawings.

The present invention transmits signals from a voltage level to a different voltage level through capacitors in such a way as to reduce power consumption, and in addition, prevent malfunctions due to external factors and correctly transmit the signals by differentially detecting the signals.

Embodiment 1

Figure 1:
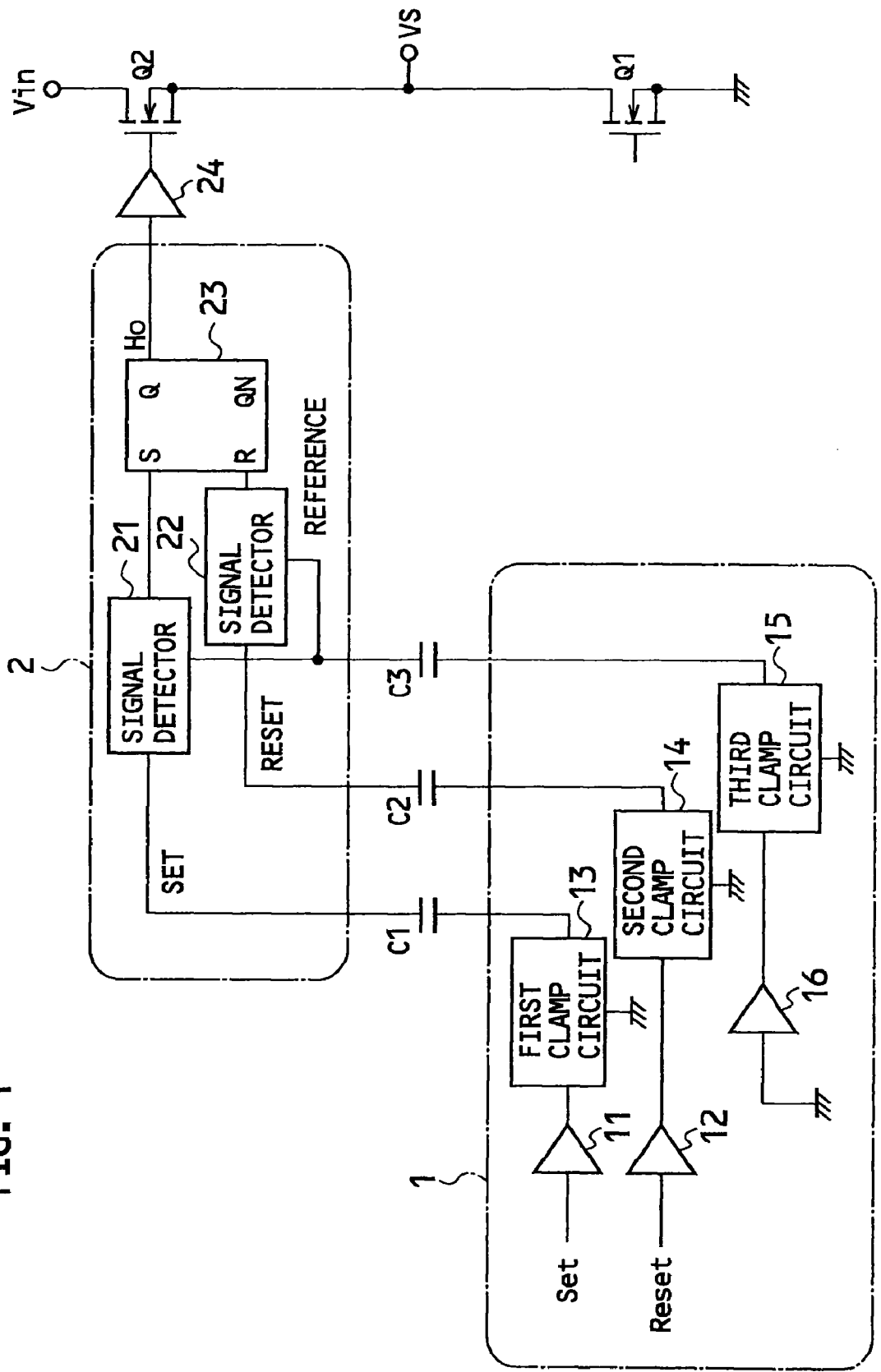
FIG. 1 is a circuit diagram illustrating a level shift circuit according to Embodiment 1 of the present invention.

FIG. 1 is a circuit diagram illustrating a level shift circuit according to Embodiment 1 of the present invention. The level shift circuit of FIG. 1 includes a low-side circuit 1, high-side circuit 2, and first to third capacitors C1 to C3 connecting the low- and high-side circuits 1 and 2 to each other.

In connection with the level shift circuit, a series circuit having a low-side switch Q1 made of a MOSFET and a high-side switch Q2 made of a MOSFET is connected between a power source Vin and the ground. The low- and high-side switches Q1 and Q2 form a half-bridge circuit. The high-side switch Q2 is driven by a driver 24. Instead of the half-bridge circuit, a full-bridge circuit is employable.

The low-side circuit 1 includes buffers 11, 12, and 16 and first to third clamp circuits 13, 14, and 15. The buffer 11 drivers the first capacitor C1 in synchronization with a set signal supplied to a set input terminal. The buffer 12 drives the second capacitor C2 in synchronization with a reset signal supplied to a reset input terminal. An input terminal of the buffer 16 is grounded.

The first clamp circuit 13 has an input terminal connected to an output terminal of the buffer 11 and an output terminal connected to a low-side terminal of the first capacitor C1. The first clamp circuit 13 clamps a low-side terminal voltage of the first capacitor C1 within a predetermined voltage range. The second clamp circuit 14 has an input terminal connected to an output terminal of the buffer 12 and an output terminal connected to a low-side terminal of the second capacitor C2. The second clamp circuit 14 clamps a low-side terminal voltage of the second capacitor C2 within a predetermined voltage range. The third clamp circuit 15 has an input terminal connected to an output terminal of the buffer 16 and an output terminal connected to a low-side terminal of the third capacitor C3. The third clamp circuit 15 clamps a low-side terminal voltage of the third capacitor C3 within a predetermined voltage range.

The high-side circuit 2 includes signal detectors 21 and 22 and a latch 23. The signal detector 21 is connected to a high-side terminal of the first capacitor C1, a high-side terminal of the third capacitor C3, and a set terminal S of the latch 23. The signal detector 21 corresponds to the set-level circuit stipulated in the claims. The signal detector 21 detects a voltage difference between a voltage of the first capacitor C1 and a voltage of the third capacitor C3 (corresponding to the reference signal stipulated in the claims), and if the voltage difference is equal to or greater than a predetermined value, transmits a set signal from the first clamp circuit 13, to set a logic voltage state of the latch 23.

The signal detector 22 is connected to a low-side terminal of the second capacitor C2, the high-side terminal of the third capacitor C3, and a reset terminal R of the latch 23. The signal detector 22 corresponds to the reset-level circuit stipulated in the claims. The signal detector 22 detects a voltage difference between a voltage of the second capacitor C2 and a voltage of the third capacitor C3, and if the voltage difference is equal to or greater than the predetermined value, transmits a reset signal from the second clamp circuit 14, to reset the logic voltage state of the latch 23.

The latch 23 generates an output signal according to the detected signals from the signal detectors 21 and 22 and supplies the output signal to the driver 24. The first to third capacitors C1, C2, and C3 are used to receive and transmit the set, reset, and reference signals between the high-side circuit 2 and the low-side circuit 1.

Figure 2:
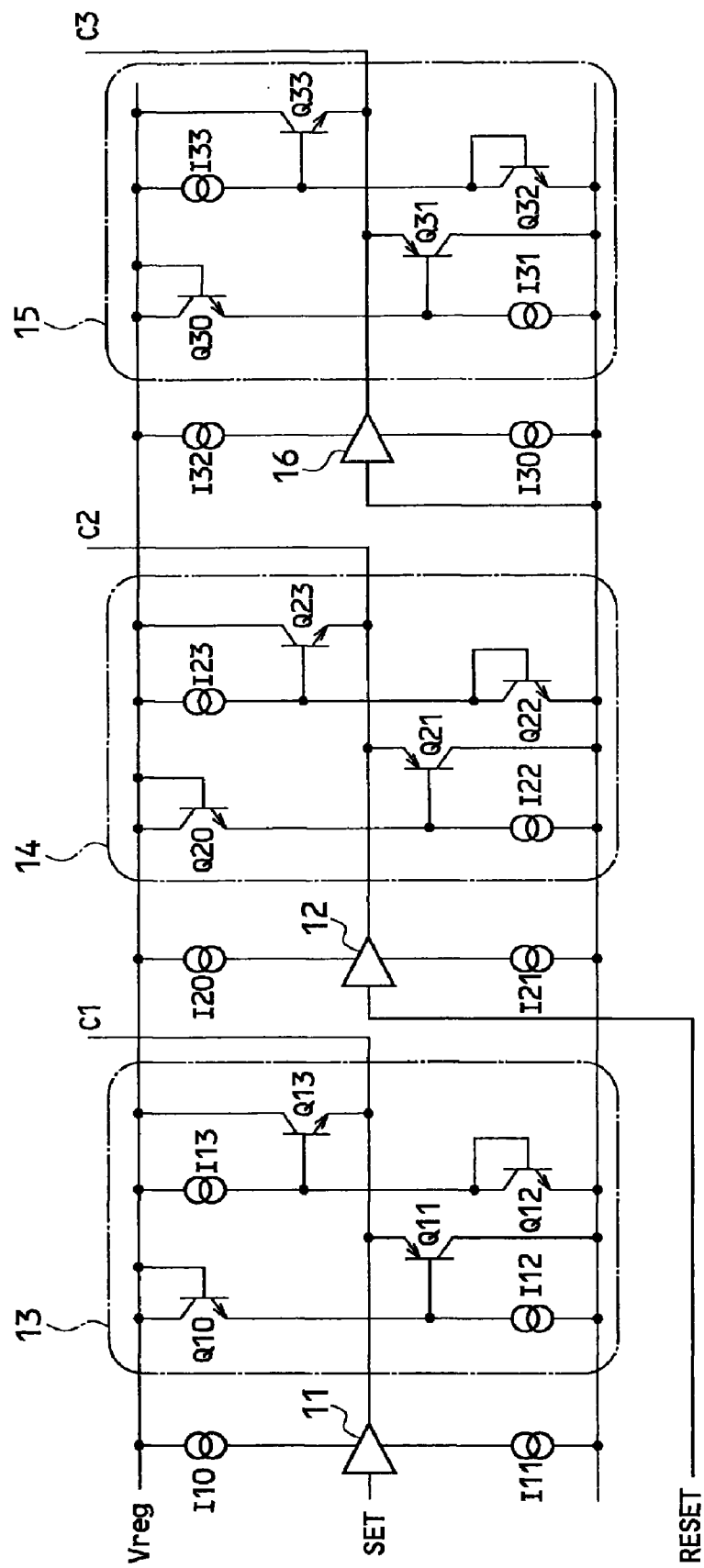
FIG. 2 is a circuit diagram illustrating a low-side circuit in the level shift circuit of Embodiment 1.

FIG. 2 is a circuit diagram illustrating the low-side circuit 1 in the level shift circuit of Embodiment 1.

In FIG. 2, the buffer 11 is connected to current sources I10 and I11. In the first clamp circuit 13, an npn transistor Q10, a pnp transistor Q11, and a current source I12 form a first plus clamp circuit. The first plus clamp circuit prevents the low-side terminal voltage of the first capacitor C1 from exceeding a power source voltage Vreg. A base and collector of the transistor Q10 are connected to the power source Vreg and an emitter of the transistor Q10 is connected to a first end of the current source I12 and a base of the transistor Q11. A second end of the current source I12 is grounded. An emitter of the transistor Q11 is connected to the first capacitor C1 and the output terminal of the buffer 11.

An npn transistor Q12, an npn transistor Q13, and a current source I13 form a first minus clamp circuit. The first minus clamp circuit prevents the low-side terminal voltage of the first capacitor C1 from dropping below a ground voltage. Connected between the power source Vreg and the ground is a series circuit including the current source I13 and transistor Q12. A collector and base of the transistor Q12 are commonly connected. A connection point of the current source I13 and the collector and base of the transistor Q12 is connected to a base of the transistor Q13. A collector of the transistor Q13 is connected to the power source Vreg and an emitter of the transistor Q13 is connected to the first capacitor C1 and the output terminal of the buffer 11.

In FIG. 2, the buffer 12 is connected to current sources I20 and I21. In the second clamp circuit 14, an npn transistor Q20, a pnp transistor Q21, and a current source I22 form a second plus clamp circuit. The second plus clamp circuit prevents the low-side terminal voltage of the second capacitor C2 from exceeding the voltage Vreg.

A base and collector of the transistor Q20 are connected to the power source Vreg and an emitter of the transistor Q20 is connected to a first end of a current source I22 and a base of the transistor Q21. A second end of the current source I22 is grounded. An emitter of the transistor Q21 is connected to the second capacitor C2 and the output terminal of the buffer 12.

An npn transistor Q22, an npn transistor Q23, and a current source I23 form a second minus clamp circuit. The second minus clamp circuit prevents the low-side terminal voltage of the second capacitor C2 from dropping below the ground voltage. Connected between the power source Vreg and the ground is a series circuit including the current source I23 and transistor Q22. A collector and base of the transistor Q22 are commonly connected. A connection point of the current source I23 and the collector and base of the transistor Q22 is connected to a base of the transistor Q23. A collector of the transistor Q23 is connected to the power source Vreg and an emitter of the transistor Q23 is connected to the second capacitor C2 and the output terminal of the buffer 12.

In FIG. 2, the buffer 16 is connected to current sources I30 and I32. An input terminal of the buffer 16 is grounded. In the third clamp circuit 15, an npn transistor Q30, a pnp transistor Q31, and a current source I31 form a third plus clamp circuit. The third plus clamp circuit prevents the low-side terminal voltage of the third capacitor C3 from exceeding the voltage Vreg.

A base and collector of the transistor Q30 are connected to the power source Vreg and an emitter of the transistor Q30 is connected to a first end of the current source I31 and a base of the transistor Q31. A second end of the current source I31 is grounded. An emitter of the transistor Q31 is connected to the third capacitor C3 and the output terminal of the buffer 16.

An npn transistor Q32, an npn transistor Q33, and a current source I33 form a third minus clump circuit. The third minus clamp circuit prevents the low-side terminal voltage of the third capacitor C3 from dropping below the ground voltage. Connected between the power source Vreg and the ground is a series circuit including the current source I33 and transistor Q32. A collector and base of the transistor Q32 are commonly connected. A connection point of the current source I33 and the collector and base of the transistor Q32 is connected to a base of the transistor Q33. A collector of the transistor Q33 is connected to the power source Vreg and an emitter of the transistor Q33 is connected to the third capacitor C3 and the output terminal of the buffer 16.

The buffer 11 changes the low-side terminal voltage of the first capacitor C1 in response to an input signal. The buffer 12 changes the low-side terminal voltage of the second capacitor C2 in response to an input signal. At this time, a voltage across the first capacitor C1 or the second capacitor C2 does not change, and therefore, high-side terminal voltages of the first and second capacitors C1 and C2 change according to changes in the low-side terminal voltages.

Similarly, if the high-side terminal voltage of any one of the first to third capacitors C1, C2, and C3 increases or decreases, the low-side terminal voltage thereof increases or decreases accordingly.

The low-side terminal of each of the first to third capacitors C1 to C3 is connected to the low-side circuit 1 and the low-side terminal voltage of each capacitor is regulated within a range from the power source voltage Vreg to the ground voltage by the corresponding plus and minus clamp circuits. Accordingly, the low-side circuit 1 receives no overvoltage or counter voltage and causes no malfunctions or element breakage.

An output from the buffer 11 is restricted by the current sources I10 and I11, an output from the buffer 12 is restricted by the current sources I20 and I21, and an output from the buffer 16 is restricted by the current sources I32 and I30. Namely, the output capacities of the buffers 11, 12, and 16 are limited by the current sources I10, I11, I20, I21, I30, and I32, to reduce excessive current stress on the buffers 11, 12, and 16 caused by the charging/discharging of the first to third capacitors C1 to C3.

Figure 3:
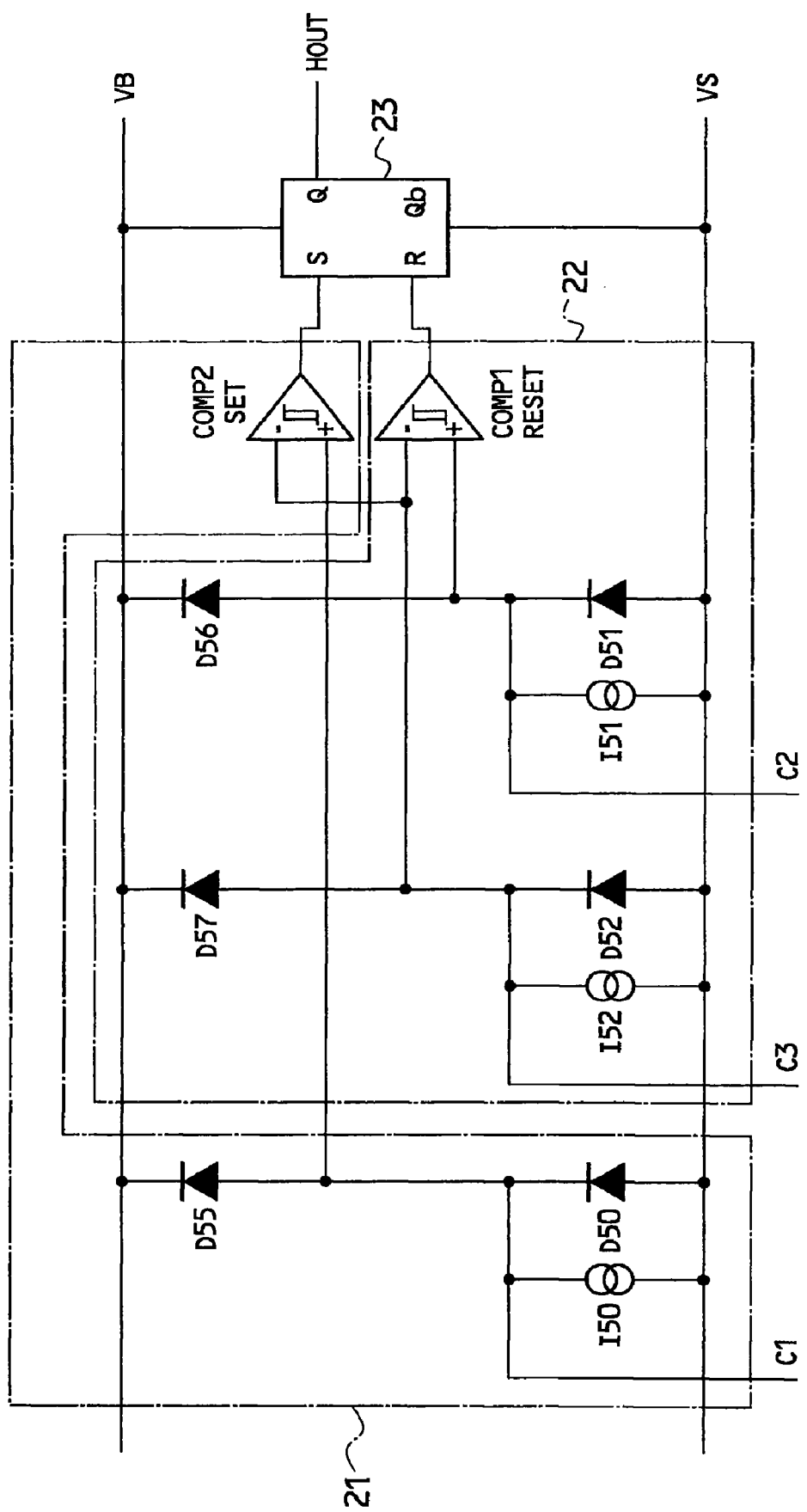
FIG. 3 is a circuit diagram illustrating a high-side circuit in the level shift circuit of Embodiment 1.

FIG. 3 is a circuit diagram illustrating the high-side circuit 2 in the level shift circuit of Embodiment 1.

In FIG. 3, the signal detector 21 includes a current source I50, diodes D50 and D55, and a comparator COMP2.

The current source I50 is connected between the high-side terminal of the first capacitor C1 and a high-side ground VS. The voltage of the high-side ground VS is a voltage at a connection point of the high- and low-side switches Q2 and Q1. The diode D50 is connected in parallel with the current source I50. The diode D55 is connected between the high-side terminal of the first capacitor C1 and a high-side power source VB.

The comparator COMP2 has an inverting input terminal connected to the high-side terminal of the third capacitor C3 and a non-inverting input terminal connected to the high-side terminal of the first capacitor C1. If a voltage at the non-inverting input terminal and a voltage at the inverting input terminal produce a predetermined voltage difference or greater, the comparator COMP2 changes its output from low to high.

In FIG. 3, the signal detector 22 includes current sources I51 and I52, diodes D51, D52, D56, and D57, and a comparator COMP1.

The current source I51 is connected between the high-side terminal of the second capacitor C2 and the high-side ground VS. The diode D51 is connected in parallel with the current source I51. The diode D56 is connected between the high-side terminal of the second capacitor C2 and the high-side power source VB.

The current source I52 is connected between the high-side terminal of the third capacitor C3 and the high-side ground VS. The diode D52 is connected in parallel with the current source I52. The diode D57 is connected between the high-side terminal of the third capacitor C3 and the high-side power source VB.

The comparator COMP1 has an inverting input terminal connected to the high-side terminal of the third capacitor C3 and a non-inverting input terminal connected to the high-side terminal of the second capacitor C2. If a voltage at the non-inverting input terminal and a voltage at the inverting input terminal produce a predetermined voltage difference or greater, the comparator COMP1 changes its output from low to high.

The third clamp circuit 15, buffer 16, third capacitor C3, current source I52, and diodes D52 and D57 form the reference-level circuit stipulated in the claims that provides a reference signal used to detect a set signal and a reset signal.

The latch 23 has the set terminal S to receive an output from the comparator COMP2 and the reset terminal R to receive an output from the comparator COMP1.

Figure 4:
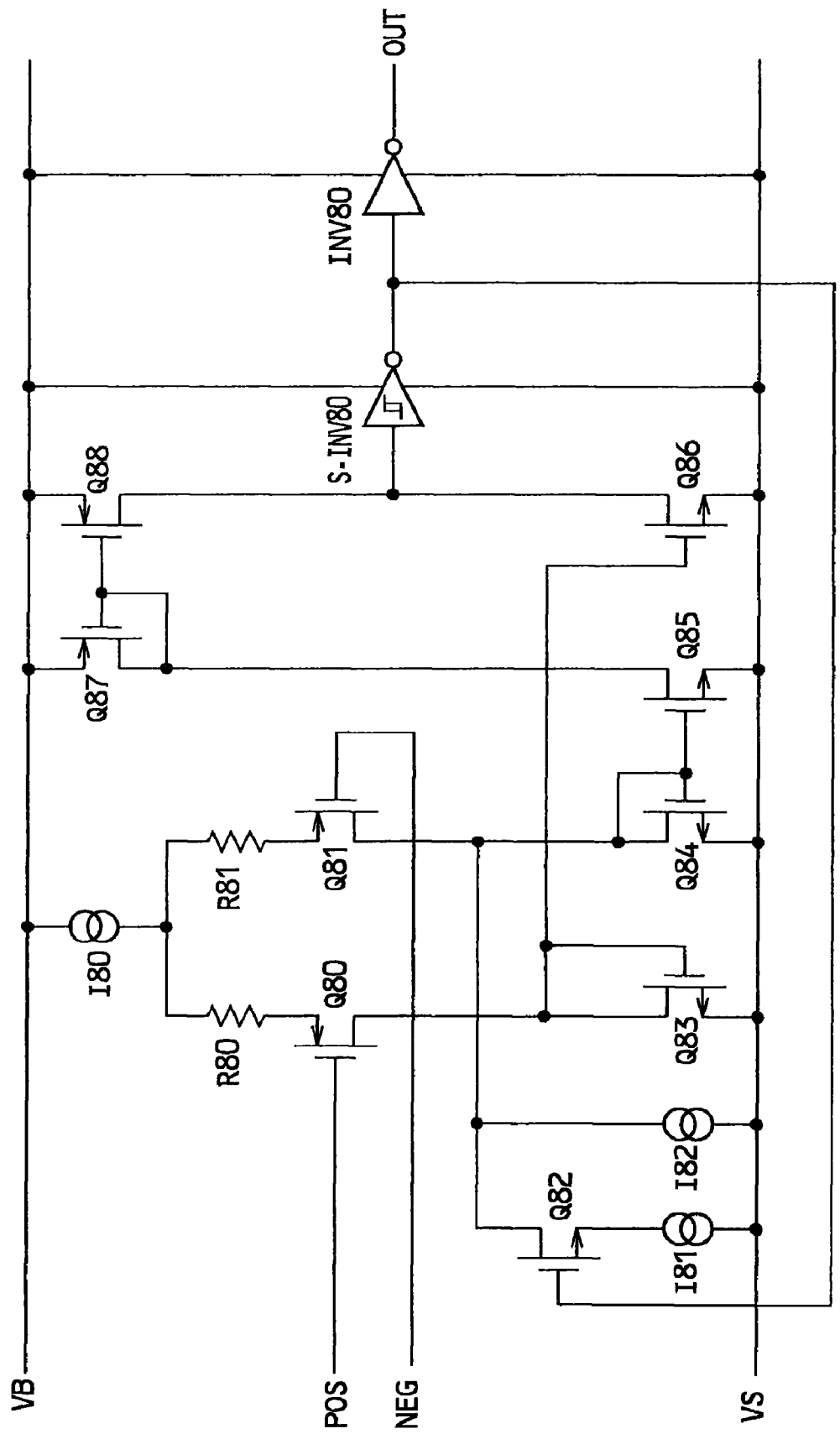
FIG. 4 is a circuit diagram illustrating an example of a comparator in the high-side circuit of FIG. 3.

FIG. 4 is a circuit diagram illustrating an example of one of the comparators COMP1 and COMP2 in the high-side circuit 2 illustrated in FIG. 3. In FIG. 4, the comparator COMP1 (COMP2) includes a series circuit connected between the high-side power source VB and the high-side ground VS. The series circuit includes a current source I80, a resistor R80, a p-type MOSFET Q80, and an n-type MOSFET Q83. Also connected between the high-side power source VB and the high-side ground VS is a series circuit including the current source I80, a resistor R81, a p-type MOSFET Q81, and an n-type MOSFET Q84.

The p-type MOSFETs Q80 and Q81 form a differential pair. A gate of the p-type MOSFET Q80 is the non-inverting input terminal and a gate of the p-type MOSFET Q81 is the inverting input terminal. Between a connection point of drains of the p-type MOSFETs Q81 and Q84 and the high-side ground VS, there are connected a current source I82 and a series circuit including an n-type MOSFET Q82 and a current source I81. The n-type MOSFET Q82 turns on if an output from a Schmitt inverter S-INV80 is high.

Between the high-side power source VB and the high-side ground VS, a series circuit including a p-type MOSFET Q87 and an n-type MOSFET Q85 is connected. Also between the high-side power source VB and the high-side ground VS, a series circuit including a p-type MOSFET Q88 and an n-type MOSFET Q86 is connected.

The n-type MOSFETs Q84 and Q85 form a first current mirror circuit, the n-type MOSFETs Q83 and Q86 form a second current mirror circuit, and the p-type MOSFETs Q87 and Q88 form a third current mirror circuit.

A connection point of the p-type MOSFET Q88 and n-type MOSFET Q86 is connected to an input terminal of the Schmitt inverter S-INV80. The Schmitt inverter S-INV80 outputs through an inverter INV80 an output signal OUT.

If a voltage to the inverting input terminal of the comparator COMP1 (COMP2) and a voltage to the non-inverting input terminal of the same are equal to each other, drains of the p-type MOSFETs Q80 and Q81 pass the same current. At this time, the current of the p-type MOSFET Q80 is passed through the second current mirror circuit to the drain of the n-type MOSFET Q86.

On the other hand, the drain current of the p-type MOSFET Q81 is reduced by currents from the current sources I81 and I82 and is passed through the first and third current mirror circuits to a drain of the p-type MOSFET Q88.

The drains of the n-type MOSFET Q86 and p-type MOSFET Q88 are connected to each other, and therefore, the currents pass through the n- and p-type MOSFETs Q86 and Q88 are compared with each other to determine a drain terminal voltage of the n- and p-type MOSFETs Q86 and Q88.

If there is no voltage difference between the inverting and non-inverting input terminals of the comparator COMP1 (COMP2), the drain current of the p-type MOSFET Q81 is reduced by the currents from the current sources I81 and I82, and therefore, the current to the n-type MOSFET Q86 becomes larger than that to the p-type MOSFET Q88. As results, a drain voltage of the n-type MOSFET Q86 becomes low. This low level is inverted by the Schmitt inverter S-INV80 and is again inverted by the inverter INV80, to provide a low-level output.

If the voltage to the non-inverting input terminal of the comparator COMP1 (COMP2) is higher than the voltage to the inverting input terminal thereof, the current to the p-type MOSFET Q80 is smaller than the current to the p-type MOSFET Q81. If the difference between the currents to the p-type MOSFETs Q80 and Q81 is larger than the sum of the currents from the current sources I81 and I82, the current to the n-type MOSFET Q86 is smaller than the current to the p-type MOSFET Q88. As results, the drain terminal voltage of the n-type MOSFET Q86 becomes high. This high level is inverted by the Schmitt inverter S-INV80 and is again inverted by the inverter INV80, to provide a high-level output.

Charging voltages of the first to third capacitors C1 to C3 are restricted within the range between the high-side power source VB and the high-side ground VS by the diodes D50, D51, D52, D55, D56, and D57. If there is external noise or if the high-side ground VS suddenly changes, voltages at the high-side terminals of the first to third capacitors C1 to C3 do not follow the changes in the high-side ground VS. Accordingly, if signal levels of the first and second capacitors C1 and C2 are detected according to the high-side ground VS, the detected signal levels will involve errors.

To prevent the erroneous signal detection, the level shift circuit of Embodiment 1 employs the third capacitor C3 that is irrelevant to signal transmission. With this, the signal detector 21 detects a voltage difference between a voltage at the high-side terminal of the signal transmitting first capacitor C1 and a voltage at the high-side terminal of the third capacitor C3, and if the voltage difference is equal to or greater than a predetermined value, receives and transmits a set signal to set a logic voltage state of the latch 23. Similarly, the signal detector 22 detects a voltage difference between a voltage at the high-side terminal of the signal transmitting second capacitor C2 and a voltage at the high-side terminal of the third capacitor C3, and if the voltage difference is equal to or greater than the predetermined value, receives and transmits a reset signal to reset the logic voltage state of the latch 23.

Namely, Embodiment 1 detects a voltage difference between the voltages of the first and third capacitors C1 and C3, as well as a voltage difference between the voltages of the second and third capacitors C2 and C3, to thereby realize stabilized signal transmission without the influence of noise components applied to the high-side ground VS.

Figure 5:
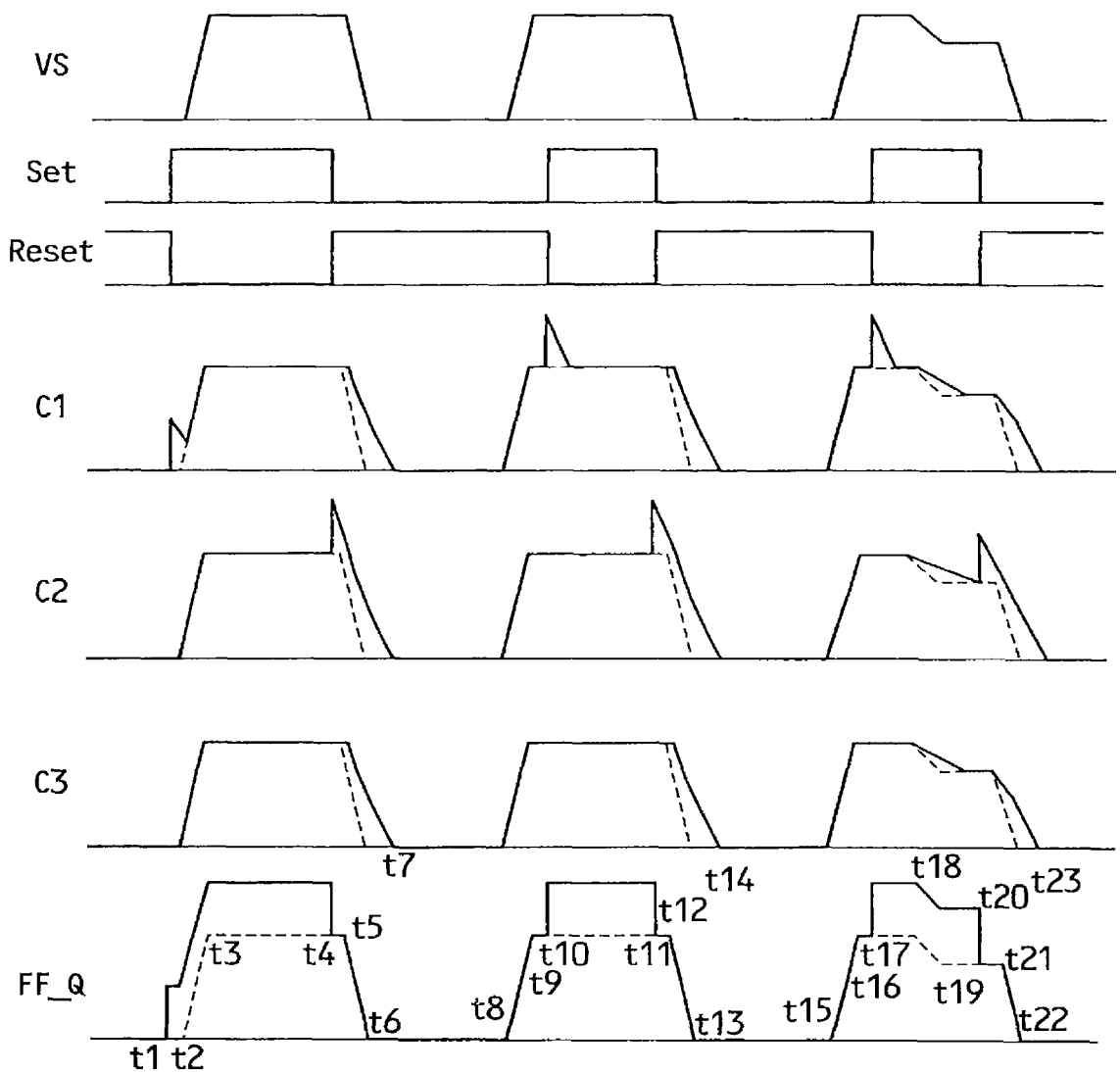
FIG. 5 is a waveform diagram illustrating operation of the level shift circuit of Embodiment 1.

FIG. 5 is a waveform diagram illustrating operation of the level shift circuit according to Embodiment 1. In FIG. 5, VS is the high-side ground voltage, Set is a low-side set signal, Reset is a low-side reset signal, C1 is a high-side terminal voltage of the first capacitor C1, C2 is a high-side terminal voltage of the second capacitor C2, C3 is a high-side terminal voltage of the third capacitor C3, and FF_Q is an output from the high-side latch 23.

At time t1 in FIG. 5, the low-side set signal Set is received and the high-side terminal voltage of the first capacitor C1 increases. The signal detector 21 compares a voltage difference between the voltages of the first and third capacitors C1 and C3 with a predetermined value and sets the high-side latch 23.

Thereafter, the high-side ground voltage VS increases in a period from t2 to t3, and then, takes a constant value. At t4, the low-side reset signal Reset is received and the high-side terminal voltage of the second capacitor C2 increases. The signal detector 22 compares a voltage difference between the voltages of the second and third capacitors C2 and C3 with the predetermined value and resets the high-side latch 23.

At time t5, the high-side ground voltage VS starts to decrease. Behind changes in the high-side ground voltage VS in a period from t5 to t6, the high-side terminal voltages of the first to third capacitors C1 to C3 change in a period from t5 to t7. At this time, the high-side terminal voltages of the second and third capacitors C2 and C3 similarly change, and therefore, there is no change in the voltage difference between the second and third capacitors C2 and C3, or the second and third capacitors C2 and C3 show the same voltage due to clamping by the diodes D56 and D57. Accordingly, the reset signal is correctly detected without error.

In consequence, Embodiment 1 can correctly detect a signal without detection error and accurately transmit the signal from a voltage level to a different voltage level at low power consumption.

At time t10 in FIG. 5, the high-side ground voltage VS is high and the low-side set signal Set is received. Then, the high-side terminal voltage of the first capacitor C1 increases to set the logic voltage state of the high-side latch 23, like the case at t1.

Since the high-side ground voltage VS is high at this time, there is no change in the capacitor voltages. At t12, the low-side reset signal Reset is received and the high-side terminal voltage of the second capacitor C2 increases to reset the logic voltage state of the high-side latch 23. Like the case at t5, the high-side ground voltage VS gradually decreases.

At time t17, the low-side set signal Set is received to set the logic voltage state of the high-side latch 23. In a period from t18 to t19, the high-side ground voltage VS changes to a negative side and keeps a low constant voltage up to t20. In this case, the high-side terminal voltages of the first to third capacitors C1 to C3 change behind the change (t18 to t19) in the high-side ground voltage VS. This change in the high-side ground voltage VS is a change with respect to a low-side ground voltage, and therefore, no deviation occurs among the terminal voltages of the first to third capacitors C1 to C3.

Embodiment 2

Figure 6:
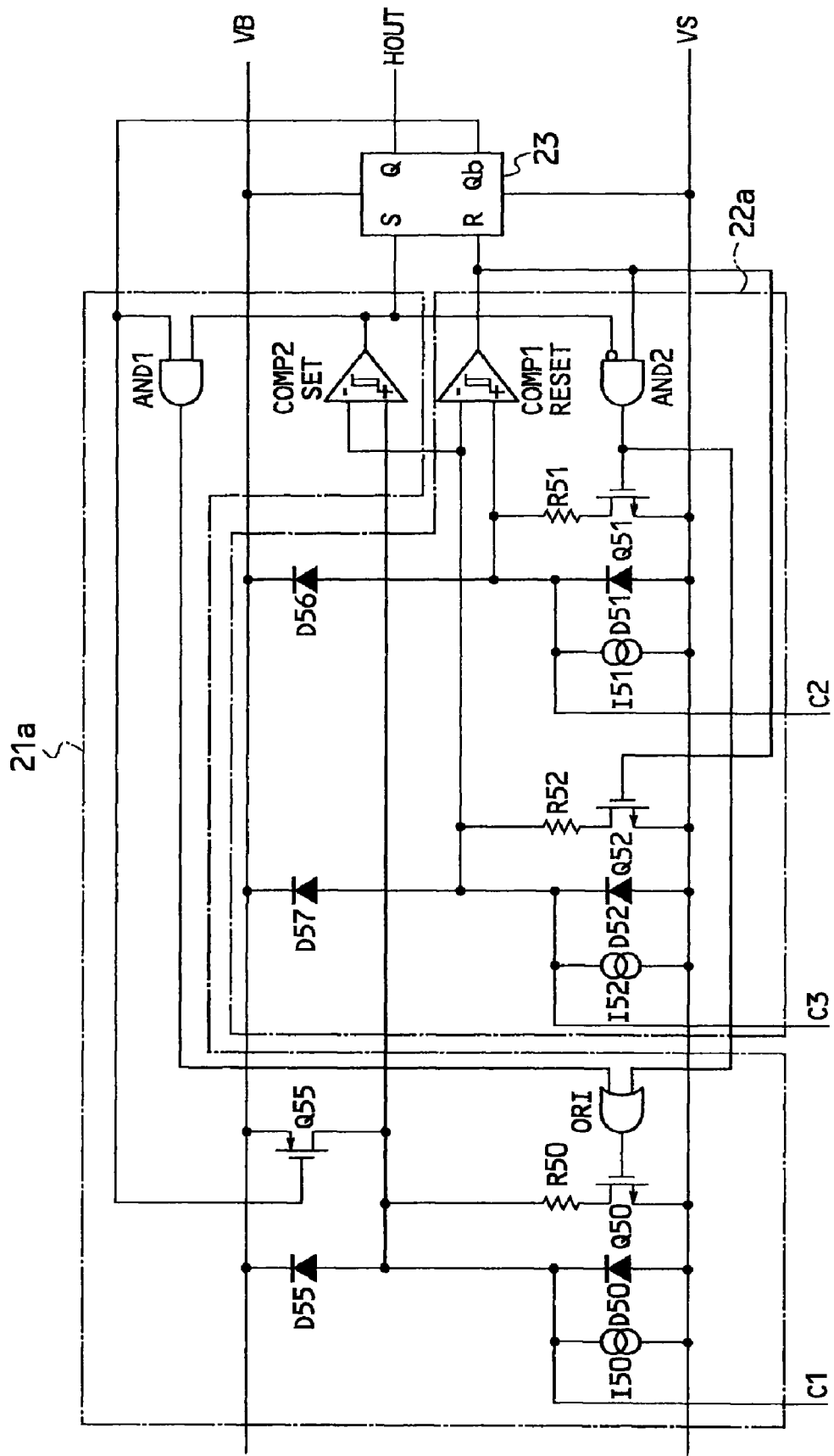
FIG. 6 is a circuit diagram illustrating a high-side circuit in a level shift circuit according to Embodiment 2 of the present invention.

FIG. 6 is a circuit diagram illustrating a high-side circuit in a level shift circuit according to Embodiment 2 of the present invention.

In FIG. 6, a signal detector 21a includes, in addition to the elements of the signal detector 21 of FIG. 3, an n-type MOSFET Q50, a resistor R50, a p-type MOSFET Q55, an AND gate AND1, and an OR gate OR1. The n-type MOSFET Q50, resistor R50, p-type MOSFET Q55, AND gate AND1, and OR gate OR1 form a discharge unit.

The n-type MOSFET Q50 and resistor R50 from a series circuit connected between ends of a diode D50. The p-type MOSFET Q55 is connected between ends of a diode D55. A gate of the p-type MOSFET Q55 is connected to an output inverting terminal Qb of a latch 23 and a first input terminal of the AND gate AND1.

A second input terminal of the AND gate AND1 is connected to an output terminal of a comparator COMP2 and a first input terminal of an AND gate AND2. An output terminal of the OR gate OR1 is connected to a gate of the n-type MOSFET Q50.

In FIG. 6, a signal detector 22a includes, in addition to the elements of the signal detector 22 of FIG. 3, an n-type MOSFET Q51, a resistor R51, an n-type MOSFET Q52, a resistor R52, and the AND gate AND2. The n-type MOSFET Q51, resistor R51, n-type MOSFET Q52, resistor R52, and AND gate AND2 form a discharge unit.

The n-type MOSFET Q51 and resistor R51 form a series circuit connected between both ends of a diode D51. The n-type MOSFET Q52 and resistor R52 form a series circuit connected between ends of a diode D52.

The first input terminal of the AND gate AND2 is connected to the output terminal of the comparator COMP2 and a second input terminal of the AND gate AND2 is connected to an output terminal of a comparator COMP1 and a gate of the n-type MOSFET Q52. An output terminal of the AND gate AND2 is connected to a gate of the n-type MOSFET Q51 and a second input terminal of the OR gate OR1.

Figure 7:
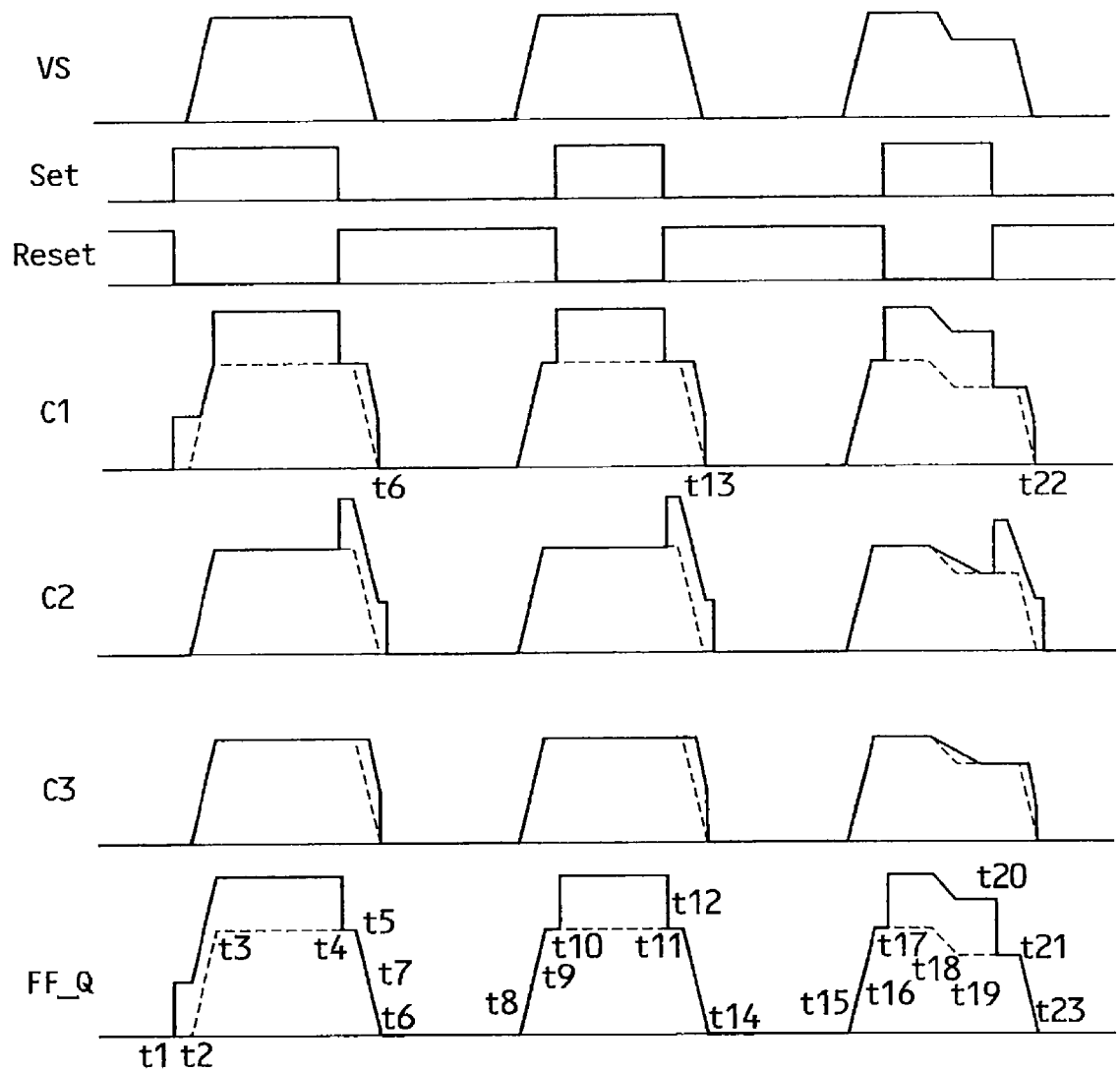
FIG. 7 is a waveform diagram illustrating operation of the level shift circuit of Embodiment 2.

FIG. 7 is a waveform diagram illustrating operation of the level shift circuit according to Embodiment 2. With reference to FIG. 7, operation of the high-side circuit illustrated in FIG. 6 will be explained.

At time t1, a set signal Set is received, a voltage at a high-side terminal of a first capacitor C1 increases, and a logic voltage state of the latch 23, i.e., a flip-flop circuit is set. When the logic voltage state of the latch 23 is set, the MOSFET Q55 turns on and a voltage at the high-side terminal of the first capacitor C1 is fixed to a level of a high-side power source VB.

At time t4, a reset signal Reset is received, a voltage at a high-side terminal of a second capacitor C2 increases, and the comparator COMP1 resets the latch 23. Then, the inverting output Qb of the latch 23 becomes high to turn off the MOSFET Q55 and the voltage at the high-side terminal of the first capacitor C1 is released from the high-side power source VB. The output of the comparator COMP1 keeps the high level, and therefore, the AND gate AND1 provides a high-level output to turn on the MOSFET Q50.

When the MOSFET Q50 turns on, the first capacitor C1 discharges to the ground. As the voltage of the first capacitor C1 decreases, the output of the comparator COMP2 changes to low. Then, the AND gate AND2 provides a high-level output to turn on the MOSFET Q51 and discharge the second capacitor C2. As results, the output of the comparator COMP1 changes to low and the high-side circuit 2 is put in a state to wait for a set signal.

If a high-side ground voltage VS greatly drops at the timing when the high-side output is stopped with a reset signal Reset, the voltage at the high-side terminal of each of the first and second capacitors C1 and C2 is clamped to the level VB. In this state, the non-inverting input terminal of each of the comparators COMP1 and COMP2 detects the level VB. However, a high-side terminal of a third capacitor C3 is clamped to the level VB, and therefore, the inverting input terminal of each of the comparators COMP1 and COMP2 detects the level VB. As results, the latch 23 receives no high-level signal, and therefore, never causes malfunction. A logic configuration of the latch 23 is set to reset signal priority, to surely prevent the latch 23 from being repeatedly set.

When the high-side ground VS decreases to a ground level at t6, the voltage at the high-side terminal of the first capacitor C1 is discharged through the MOSFET Q50 and the comparator COMP2 changes its output to low. Then, the AND gate AND2 provides a high-level output to turn on the MOSFET Q51 and discharge the second capacitor C2.

When the output of the AND gate AND2 becomes high, the output of the OR gate OR1 also becomes high to turn on the n-type MOSFET Q50 and discharge the first capacitor C1. As results, the comparators COMP1 and COMP2 change to low and the high-side circuit 2 is put in a state to wait for a set signal.

Unlike Embodiment 1 illustrated in FIG. 5, the high-side terminal voltages of the first to third capacitors C1 to C3 do not change behind a change in the high-side ground voltage VS.

Namely, a period from when the second capacitor C2 transmits a reset signal to when a state for again receiving a set signal is established is the sum of a delay time of the comparators COMP1 and COMP2 and a delay time of the latch 23 and logic gates. This period is shorter than a period in which a reset is achieved by natural discharge with discharging current sources I50 and I51.

At time t10 in FIG. 7, the voltage VS is high and the low-side set signal Set is received. Then, the high-side terminal voltage of the first capacitor C1 increases and the logic voltage state of the high-side latch 23 is set, like the case at t1.

At this time, the high-side ground voltage VS is already high, and therefore, is unchanged. At t11, the low-side reset signal Reset is received, the high-side terminal voltage of the second capacitor C2 increases, the logic voltage state of the high-side latch 23 is reset, and like the case at t5, the high-side ground voltage VS gradually decreases.

At time t17, the low-side set signal Set is received. In a period from t18 to t19, the high-side latch 23 is in the set state of the logic voltage state and the high-side ground voltage VS changes to a negative side and keeps a constant low value up to t20. In this case, the high-side terminal voltages of the first to third capacitors C1 to C3 change behind the change (t18 to t19) in the high-side ground voltage VS. This change in the high-side ground voltage VS is a change with respect to a low-side ground voltage, and therefore, no deviation occurs among the terminal voltages of the first to third capacitors C1 to C3.

Embodiment 3

Figure 8:
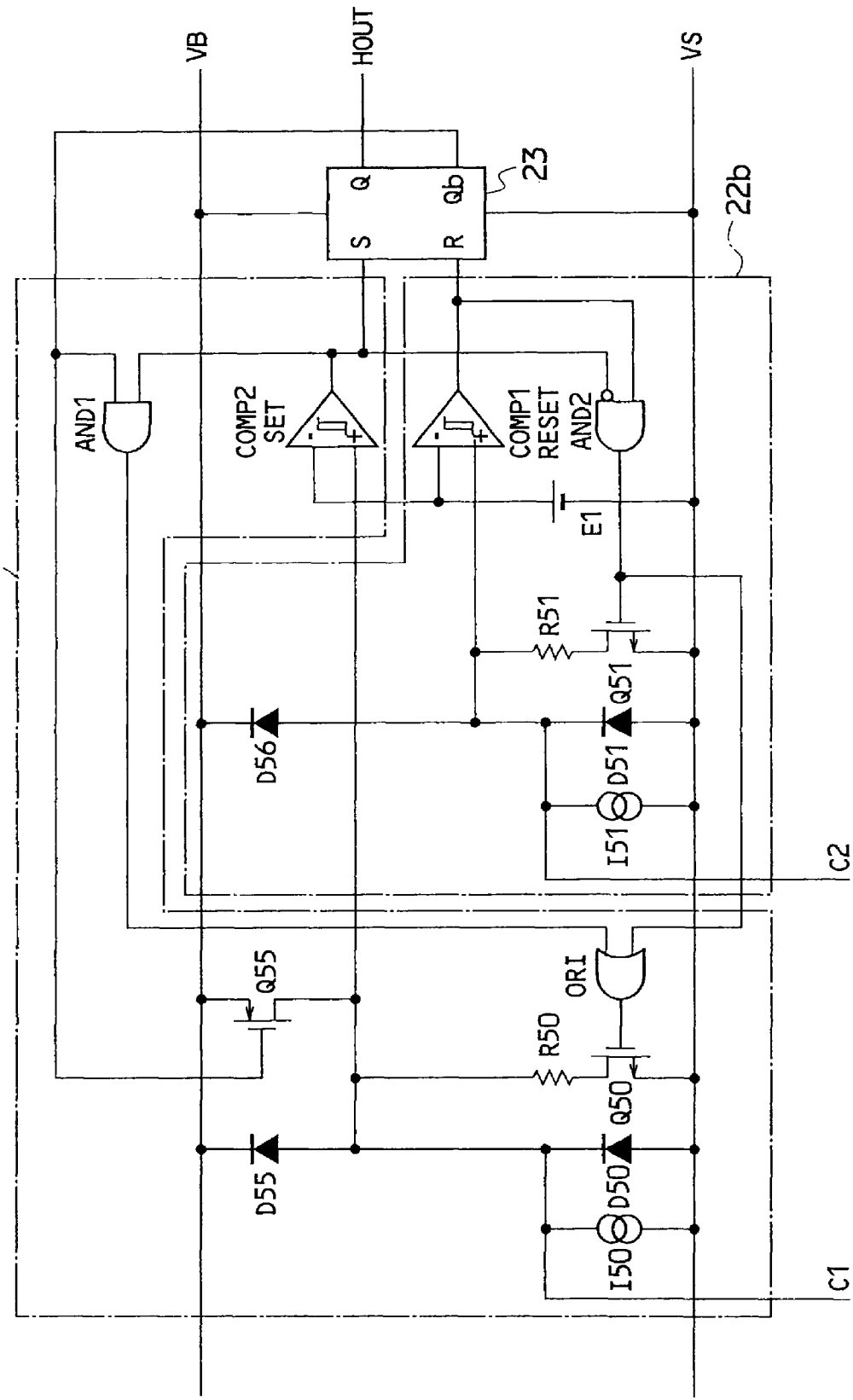
FIG. 8 is a circuit diagram illustrating a high-side circuit in a level shift circuit according to Embodiment 3 of the present invention.

FIG. 8 is a circuit diagram illustrating a high-side circuit in a level shift circuit according to Embodiment 3 of the present invention.

The level shift circuit illustrated in FIG. 8 differs from the level shift circuit of FIG. 6 in that a signal detector 22b is structurally different from the signal detector 22a. Namely, the signal detector 22b of FIG. 8 includes a current source I51, diodes D51 and D56, an n-type MOSFET Q51, a resistor R51, an AND gate AND2, a comparator COMP1, and a reference power source E1 and omits the current source I52, diodes D52 and D57, n-type MOSFET Q52, and resistor R52. In connection with this, the third capacitor C3 and third clamp circuit 15 are omitted.

In the level shift circuit of Embodiment 3, the reference power source E1 function as the third capacitor C3 to supply a reference voltage to inverting input terminals of the comparators COMP1 and COMP2.

Figure 9:
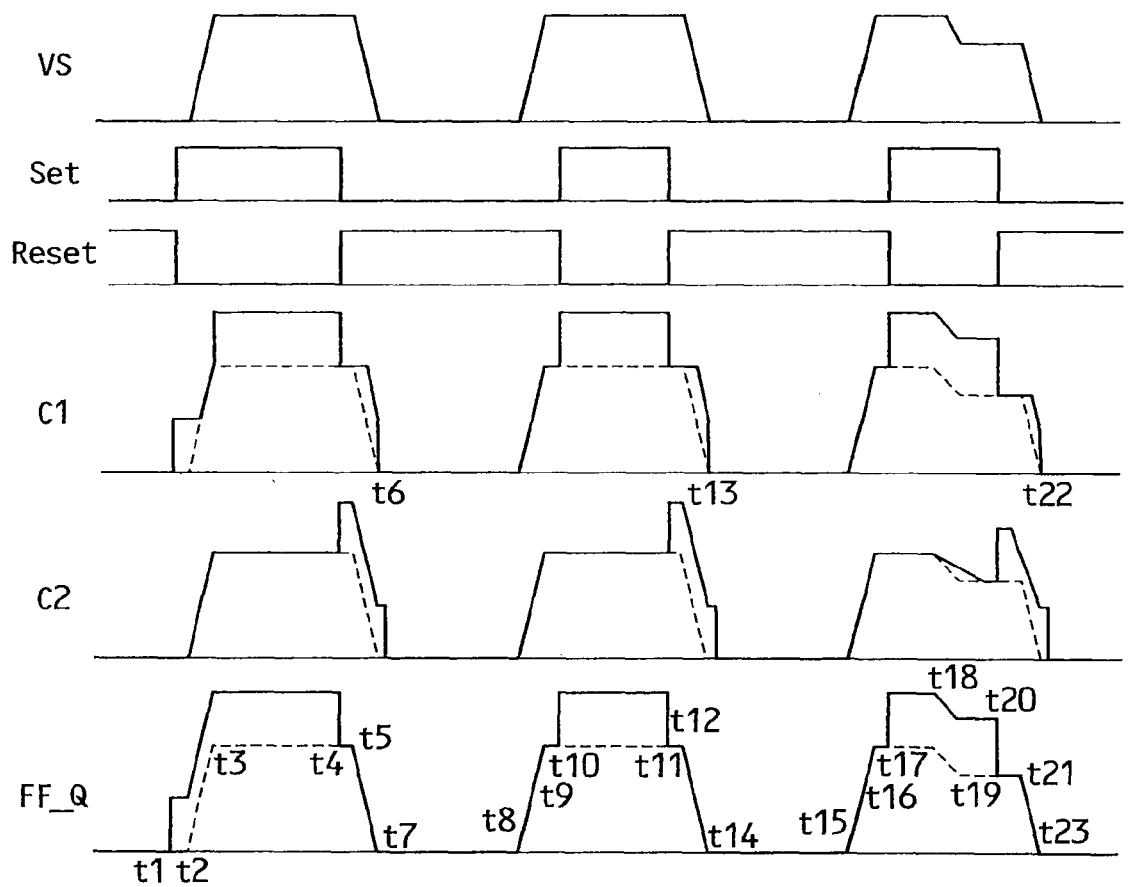
FIG. 9 is a waveform diagram illustrating operation of the level shift circuit of Embodiment 3.

FIG. 9 is a waveform diagram illustrating operation of the level shift circuit of Embodiment 3. The waveform diagram of FIG. 9 is the same as that of FIG. 7 except that FIG. 9 has no high-side terminal voltage of the third capacitor C3.

The level shift circuit of Embodiment 3 provides operation and effect similar to those provided by the level shift circuit of Embodiment 2. The signal detector 22b of Embodiment 3 is simpler than the signal detector 22a of Embodiment 2, to simplify the level shift circuit.

EFFECT OF INVENTION

According to the present invention, the set-level circuit (signal detector 21) detects a voltage difference between a set signal and a reference signal provided by the reference-level circuit (third capacitor C3 and other elements, or power source E1) and if the voltage difference is equal to or greater than a predetermined value, sets a logic voltage state. The reset-level circuit (signal detector 22) detects a voltage difference between a reset signal and the reference signal, and if the voltage difference is equal to or greater than the predetermined value, resets the logic voltage state. Accordingly, the present invention prevents malfunctions due to external factors such as voltage variation and correctly transmits a signal between different voltage levels.

This application claims benefit of priority under 35USC §119 to Japanese Patent Application No. 2008-293416, filed on Nov. 17, 2008, the entire content of which is incorporated by reference herein. Although the invention has been described above by reference to certain embodiments of the invention, the invention is not limited to the embodiments described above. Modifications and variations of the embodiments described above will occur to those skilled in the art, in light of the teachings. The scope of the invention is defined with reference to the following claims.

What is claimed is:

1. A level shift circuit for shifting a first voltage level to a second voltage level that is different from the first voltage level, comprising:
    a set-level circuit configured to transmit a set signal that is used to set a logic voltage state of the second voltage level;
    a reset-level circuit configured to transmit a reset signal that is used to reset the logic voltage state of the second voltage level; and
    a reference-level circuit configured to provide a reference signal that is used to detect the set signal and reset signal based on the second voltage level,
    the set-level circuit, reset-level circuit, and reference-level circuit each transmitting signals from the first voltage level to the second voltage level through each capacitor, respectively.

2. The level shift circuit of claim 1, wherein:
    the set-level circuit detects a voltage difference between the set signal and the reference signal, and if the voltage difference is equal to or greater than a predetermined value, sets the logic voltage state; and
    the reset-level circuit detects a voltage difference between the reset signal and the reference signal, and if the voltage difference is equal to or greater than the predetermined value, resets the logic voltage state.

* * * * *